(12) United States Patent
Koyama (10) Patent No.: US 10,651,186 B2
(45) Date of Patent: May 12, 2020

(54) SEMICONDUCTOR MEMORY DEVICE (71) Applicant: TOSHIBA MEMORY CORPORATION, Tokyo (JP)

(72) Inventor: Yukinori Koyama, Mie Yokkaichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/122,492

(22) Filed: Sep. 5, 2018

(65) Prior Publication Data

US 2019/0287983 A1 Sep. 19, 2019

(30) Foreign Application Priority Data

Mar. 15, 2018 (JP) ................................. 2018-048447

(51) Int. Cl.
| | |
|---|---|
| *H01L 27/11551* | (2017.01) |
| *H01L 27/11556* | (2017.01) |
| *H01L 27/11519* | (2017.01) |
| *H01L 27/11565* | (2017.01) |
| *H01L 27/11582* | (2017.01) |
| *H01L 29/792* | (2006.01) |
| *H01L 27/1157* | (2017.01) |
| *H01L 27/11524* | (2017.01) |

(52) U.S. Cl.
CPC .... *H01L 27/11556* (2013.01); *H01L 27/1157* (2013.01); *H01L 27/11519* (2013.01); *H01L 27/11524* (2013.01); *H01L 27/11565* (2013.01); *H01L 27/11582* (2013.01); *H01L 29/7926* (2013.01)

(58) Field of Classification Search
CPC ......... H01L 27/11551; H01L 27/11529; H01L 27/11556; H01L 27/11524; H01L 27/1157
See application file for complete search history.

(56) References Cited

U.S. PATENT DOCUMENTS

| | | |
|---|---|---|
| 2011/0073866 A1 | 3/2011 | Kim et al. |
| 2017/0338243 A1 | 11/2017 | Sohn et al. |

*Primary Examiner* — Hsien Ming Lee
(74) *Attorney, Agent, or Firm* — Foley & Lardner LLP (57) ABSTRACT

A semiconductor memory device includes a substrate, a first electrode, a second electrode, a signal line, a first charge storage film and a second charge storage film. The first and second electrodes extend in a first direction parallel to the substrate. The first electrode has first and second surfaces. The second electrode has third and fourth surfaces. The spacing between the second and fourth surfaces is larger than the spacing between the first and third surfaces. The signal line is provided between the second surface and the fourth surface and extends in a second direction perpendicular to the substrate. The first charge storage film is provided between the signal line and the second surface. The second charge storage film is provided between the signal line and the fourth surface. In a cross section parallel to the substrate, the signal line has a contour having different curvatures.

17 Claims, 12 Drawing Sheets

SEMICONDUCTOR MEMORY DEVICE

CROSS-REFERENCE TO RELATED APPLICATIONS

This application is based upon and claims the benefit of priority from Japanese Patent Application No. 2018-048447, filed on Mar. 15, 2018; the entire contents of which are incorporated herein by reference.

FIELD

Embodiments relate to a semiconductor memory device.

BACKGROUND

In a NAND-type memory device including memory cells arranged in three dimensions, the cell current flowing in the memory cell decreases with the miniaturization of the memory cell.

BRIEF DESCRIPTION OF THE DRAWINGS

FIGS. 2A to 8B are schematic views showing the manufacturing process of the memory device according to the first embodiment;

FIGS. 10A to 12B are schematic views showing a manufacturing process of the memory device according to the second embodiment.

DETAILED DESCRIPTION

According to one embodiment, a semiconductor memory device includes a substrate, a first electrode, a second electrode, a signal line, a first charge storage film and a second charge storage film. The first electrode extends in a first direction parallel to a surface of the substrate and has a first surface and a second surface. The first surface is spread in the first direction and a second direction crossing the first direction and perpendicular to the substrate. The second surface is spread in the first direction and the second direction, has a periphery connected to the first surface, and is provided to extend inward in a third direction with respect to the first surface, wherein the third direction is parallel to the substrate and crosses the first direction. The second electrode extends in the first direction and has a third surface and a fourth surface. The third surface is spaced from the first electrode in a fourth direction opposite to the third direction, and spreads in the first direction and the second direction. The fourth surface is opposed to the second surface and spreads in the first direction and the second direction, has a periphery connected to the third surface, and is provided to extend inward in the fourth direction with respect to the third surface. The signal line is provided between the second surface and the fourth surface and extends in the second direction. The first charge storage film is provided between the signal line and the second surface and includes first parts provided at both ends in the first direction and a second part located between the first parts. The second part is provided to protrude in the third direction toward the second surface with respect to the first parts. The second charge storage film is provided between the signal line and the fourth surface and includes third parts provided at both ends in the first direction and a fourth part located between the third parts. The fourth part is provided to protrude in the fourth direction toward the fourth surface with respect to the third parts. A distance along the third direction between the second surface and the fourth surface is larger than a distance along the third direction between the first surface and the third surface. In a cross section passing through the first charge storage film and the second charge storage film and being parallel to the surface of the substrate, the signal line has a contour formed from a fifth part opposed to the second part, a sixth part opposed to the fourth part, a seventh part connected to one end of the fifth part and one end of the sixth part. The seventh part is provided in the first direction. The eighth part is connected to the other end of the fifth part and the other end of the sixth part. The eighth part is provided in a direction opposite to the first direction. The seventh part includes a portion having a curvature different from a curvature in a portion of the fifth part positioned in a vicinity of the one end of the fifth part or a curvature in a portion of the sixth part positioned in a vicinity of the one end of the sixth part. The eighth part includes a portion having a curvature different from a curvature in other portion of the fifth part positioned in a vicinity of the other end of the fifth part or a curvature in other portion of the sixth part positioned in a vicinity of the other end of the sixth part.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

(First Embodiment)

Figure 1A:
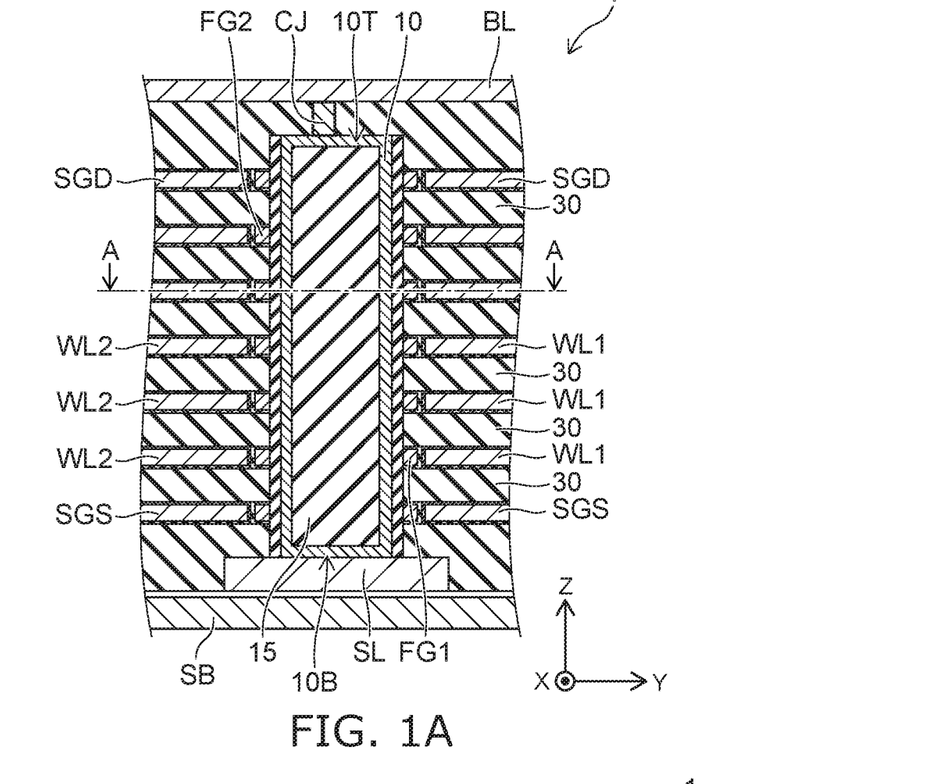
FIGS. 1A and 1B are schematic views showing a memory device according to a first embodiment.
Figure 1B:
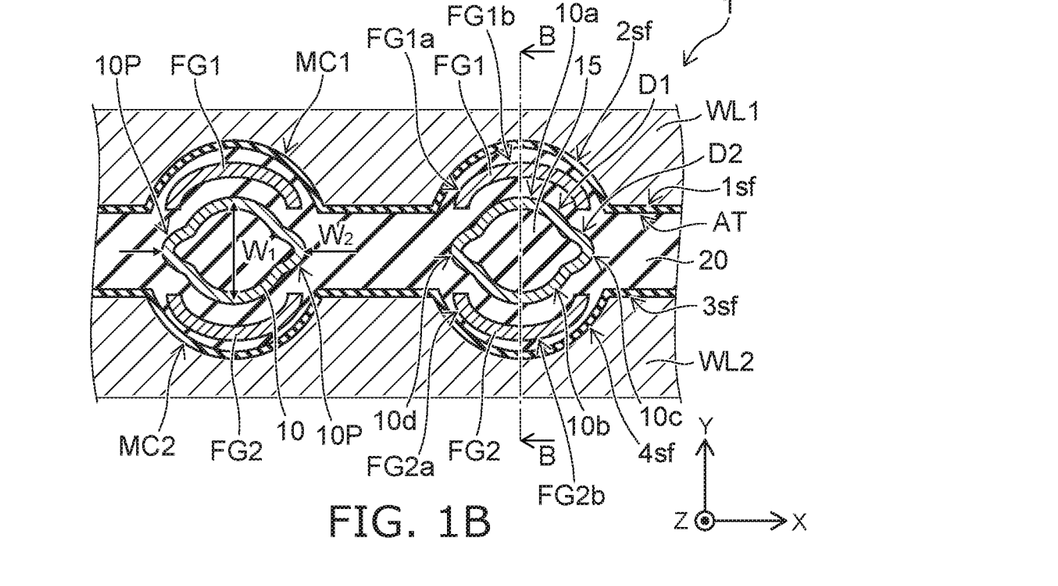

FIGS. 1A and 1B are schematic views showing a memory device 1 according to a first embodiment. FIG. 1A is a schematic view showing a cross section taken along line B-B shown in FIG. 1B. FIG. 1B is a plan view showing a cross section taken along line A-A shown in FIG. 1A.

The memory device 1 includes a substrate SB, a word line WL1, a word line WL2, a signal line (a semiconductor film 10), a floating gate FG1, a floating gate FG2, and a signal line (a semiconductor film 10).

The word line WL1 extends in the X-direction parallel to the surface of the substrate SB. The word line WL1 has a first surface $1sf$ spread in the X-direction and the Z-direction perpendicular to the substrate. The word line WL1 has a second surface $2sf$ spread in the Z-direction. The periphery of the second surface $2sf$ is connected to the first surface $1sf$. The second surface $2sf$ extends inward in the Y-direction with respect to the first surface $1sf$.

The word line WL2 extends in the X-direction. The word line WL2 is spaced in a direction opposite to the Y-direction from the word line WL1. The word line WL2 has a third surface $3sf$ spread in the X-direction and the Z-direction. The word line WL2 has a fourth surface $4sf$ spread in the Z-direction. The periphery of the fourth surface 4*sf* is connected to the third surface 3*sf*. The fourth surface 4*sf* extends inward in the direction opposite to the Y-direction with respect to the third surface 3*sf*. The fourth surface 4*sf* is opposed to the second surface 2*sf* in the Y-direction.

The word lines WL1 and WL2 are configured so that the spacing between the second surface 2*sf* and the fourth surface 4*sf* in the Y-direction is larger than the spacing between the first surface 1*sf* and the third surface 3*sf* connected thereto, respectively.

The semiconductor film 10 is provided between the second surface 2*sf* and the fourth surface 4*sf* and extends in the Z-direction. The floating gate FG1 is provided between the semiconductor film 10 and the second surface 2*sf*. The floating gate FG1 includes first parts FG1*a* and a second part FG1*b*. The first parts FG1*a* are both end parts in the X-direction of the floating gate FG1. The second part FG1*b* is located between the first parts FG1*a* provided at both ends in the X-direction of the floating gate FG1. The second part FG1*b* is provided to protrude in the Y-direction toward the second surface 2*sf* with respect to the first part FG1*a*.

The floating gate FG2 is provided between the semiconductor film 10 and the fourth surface 4*sf*. The floating gate FG2 includes third parts FG2*a* and a fourth part FG2*b*. The third parts FG2*a* are both end parts in the X-direction of the floating gate FG2. The fourth part FG2*b* is located between the third parts FG2*a* provided at both ends in the X-direction of the floating gate FG2. The fourth part FG2*b* is provided to protrude in the direction opposite to the Y-direction toward the fourth surface 4*sf* with respect to the third part FG2*a*.

The contour of the semiconductor film 10 is formed from a fifth part 10*a*, a sixth part 10*b*, a seventh part 10*c*, and an eighth part 10*d*. The fifth part 10*a* is opposed to the second part FG1*b* in a cross section passing through the floating gate FG1 and the floating gate FG2 and being parallel to the surface of the substrate SB. The sixth part 10*b* is opposed to the fourth part FG2*b*. The seventh part 10*c* is connected to one end in the X-direction of the fifth part 10*a* and one end in the X-direction of the sixth part 10*b*. The seventh part 10*c* includes a portion having a curvature different from a curvature in a portion of the fifth part 10*a* positioned in a vicinity of the one end of the fifth part 10*a* and a curvature in a portion of the sixth part 10*b* positioned in a vicinity of the one end of the sixth part 10*b*. The seventh part 10*c* is provided in the X-direction. For example, the seventh part 10*c* is formed to extend in the X-direction. The eighth part 10*d* is connected to the other end in the X-direction of the fifth part 10*a* and the other end in the X-direction of the sixth part 10*b*. The eighth part 10*d* includes a portion having a curvature different from a curvature in other portion of the fifth part 10*a* positioned in a vicinity of the other end of the fifth part 10*a* and a curvature in other portion of the sixth part 10*b* positioned in a vicinity of the other end of the sixth part 10*b*. The eighth part 10*d* is provided in a direction opposite to the X-direction. For example, the eighth part 10*d* is formed to extend in the direction opposite to the X-direction.

As shown in FIG. 1A, the memory device 1 includes a plurality of electrode layers stacked in the Z-direction via insulating films 30. The plurality of electrode layers are e.g. a select gate SGS, word lines WL, and a select gate SGD sequentially from the lower layer. The word lines WL and the select gates SGS and SGD are stacked above the substrate SB. The substrate SB is e.g. a silicon substrate.

The word lines WL include word lines WL1 and WL2 arranged in the Y-direction. In the following description, the word lines WL1 and WL2 may be described separately, or both the word lines are generically referred to as word lines WL. The other components are described likewise.

The memory device 1 further includes a semiconductor film 10, a bit line BL, and a source line SL. The semiconductor film 10 is provided between the word line WL1 and the word line WL2. The semiconductor film 10 is provided so as to surround an insulating core 15 extending in the Z-direction. The bit line BL is provided above the select gate SGD. The source line SL is provided below the semiconductor film 10.

The semiconductor film 10 extends in the Z-direction along the insulating core 15. The semiconductor film 10 is connected at its upper end 10T to the bit line BL through a connection plug CJ. The semiconductor film 10 is connected at its lower end 10B to the source line SL.

The memory device 1 further includes a plurality of floating gates FG1. The floating gates FG1 are provided between the semiconductor film 10 and a plurality of word lines WL1, respectively. The floating gates FG1 are spaced from each other in the Z-direction. The floating gates FG2 are provided between the semiconductor film 10 and a plurality of word lines WL2, respectively. The floating gates FG2 are spaced from each other in the Z-direction.

A trench AT is provided between the word line WL1 and the word line WL2. An insulating film 20 is placed inside the trench AT. The insulating film 20 electrically isolates the word line WL1 and the word line WL2 from each other. The semiconductor film 10 is provided inside the trench AT. The semiconductor film 10 is provided so as to surround the insulating core 15 placed inside the trench AT.

The memory device 1 includes memory cells MC1 and MC2. The memory cell MC1 includes a floating gate FG1 provided between the word line WL1 and the semiconductor film 10. The memory cell MC2 includes a floating gate FG2 provided between the word line WL2 and the semiconductor film 10. The memory cells MC1 and MC2 share the semiconductor film 10 and include a charge storage region between the word line WL and the semiconductor film 10. That is, the memory cells MC1 and MC2 store information by retaining the charge injected from the semiconductor film 10 into the floating gates FG1 and FG2. The memory cell MC1 stores information by application of voltage between the word line WL1 and the semiconductor film 10. The memory cell MC2 stores information by application of voltage between the word line WL2 and the semiconductor film 10.

As shown in FIG. 1B, the semiconductor film 10 includes the eighth part 10*d* projected in the direction (X-direction and −X-direction) along the word lines WL1 and WL2. Thus, the channel width of the memory cells MC1 and MC2 is expanded. This can increase the cell current flowing in the semiconductor film 10 at data read time.

The semiconductor film 10 has, at its outer edge, the width $W_1$ from one contact point of the semiconductor film 10 and the insulating core 15 to the other contact point of the semiconductor film 10 and the insulating core 15 opposed in the Y-direction, and the X-direction width $W_2$. The width $W_2$ is wider than the width $W_1$. The one point is a position with a close distance between the semiconductor film 10 and the floating gate FG1. The other point is also a position with a close distance between the semiconductor film 10 and the floating gate FG2. The eighth part 10*d* is provided at a position between the first part FG1*a* and the third part FG2*a* in the Y-direction, the position being different from the first part FG1*a* and the third part FG2*a* in the X-direction. The seventh part 10*c* may be shaped like the eighth part 10*d*.

In the aforementioned cross section, the straight line connecting both the X-direction end points and the straight line connecting both the Y-direction end points cross at an intersection point (center). The distance between the intersection point and the contour line passing through the X-direction end point and the Y-direction end point is composed of a first portion (D1) and a second portion (D2). In the first portion, the distance gradually decreases from the X-direction end point to the midpoint of the X-direction end point and the Y-direction end point. In the second portion, the distance gradually increases from the midpoint to the Y-direction end point.

The first embodiment has been described only in the case where the word line WL1 and the word line WL2 are provided and the semiconductor film 10 is provided therebetween. Although not shown, the word lines WL are arranged along the Y-direction. For instance, a second word line WL is provided adjacent to the word line WL1 in the Y-direction. An insulating film is provided between the word line WL1 and the second word line WL. Furthermore, a third word line is placed adjacent to the second word line in the Y-direction. The second word line WL and the third word line WL extend in the X-direction. A second semiconductor film is provided between the second word line WL and the third word line WL. The second semiconductor films are arranged along the X-direction.

Next, a method for manufacturing the memory device 1 according to the first embodiment is described with reference to FIGS. 2A to 8B. FIGS. 2A to 8B are schematic views sequentially showing the process for manufacturing the memory device 1.

FIGS. 2A, 2B, 3A, 4A, 4B, 5A, 7A, 8A, and 8B are schematic views showing a cross section corresponding to the cross section taken along line B-B shown in FIG. 1B. FIGS. 3B, 5B, 6, and 7B are plan views showing a cross section corresponding to the cross section taken along line A-A shown in FIG. 1A.

Figure 2A:
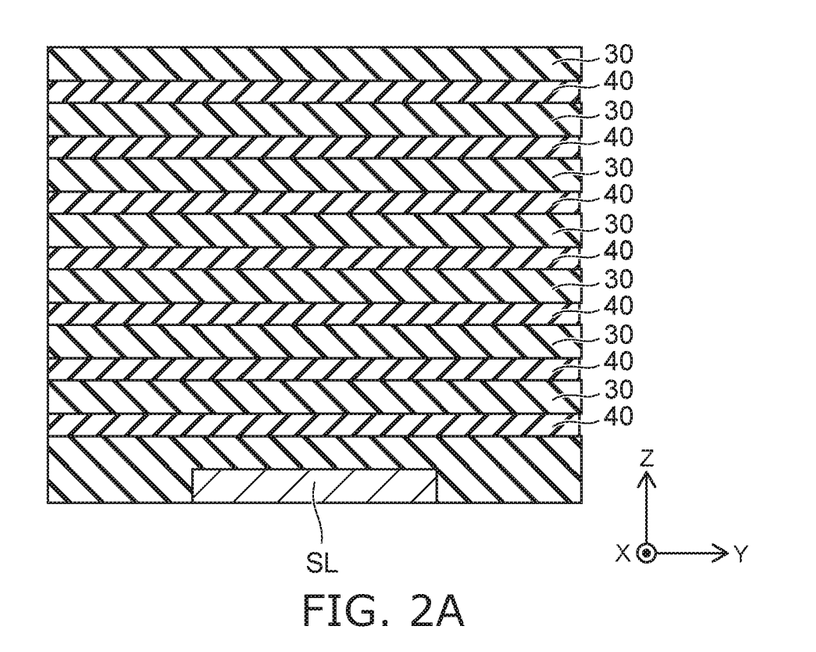

As shown in FIG. 2A, insulating films 30 and sacrificial films 40 are alternately stacked above a source line SL. The insulating film 30 is e.g. a silicon oxide film. The sacrificial film 40 is e.g. a silicon nitride film. The insulating film 30 and the sacrificial film 40 are formed using e.g. CVD (chemical vapor deposition).

Figure 2B:
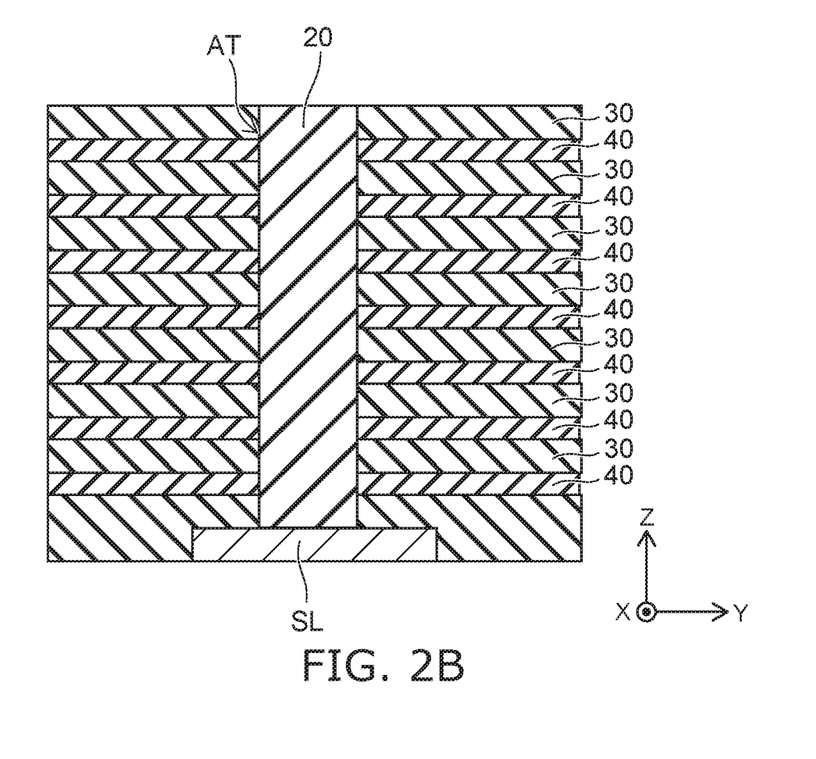

As shown in FIG. 2B, a trench AT having a depth from the upper surface of the uppermost insulating film 30 to the source line SL is formed. Then, an insulating film 20 is formed inside the trench AT. The insulating film 20 is e.g. a silicon oxide film. The insulating film 20 is deposited using e.g. CVD. Then, the portion formed above the uppermost insulating film 30 is removed using e.g. etchback or CMP (chemical mechanical polishing).

Figure 3A:
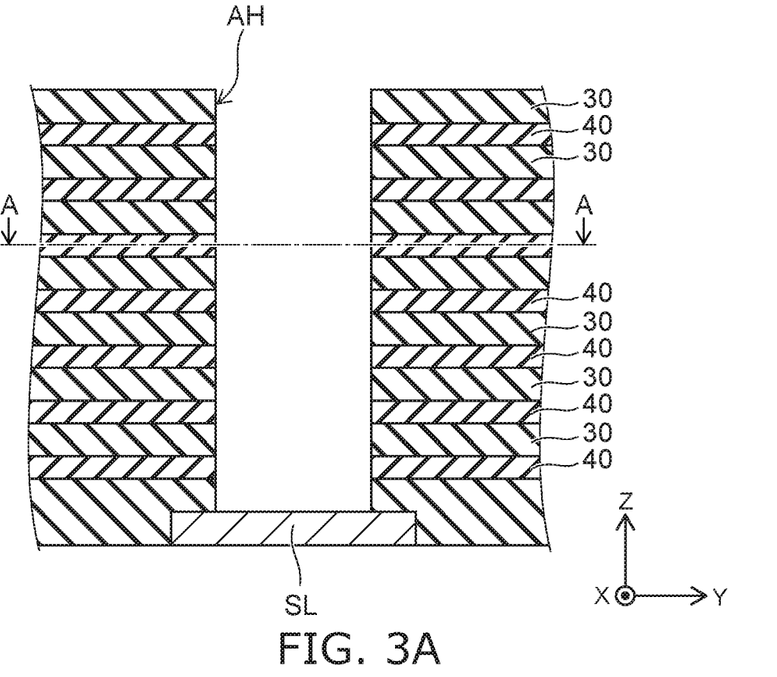
Figure 3B:
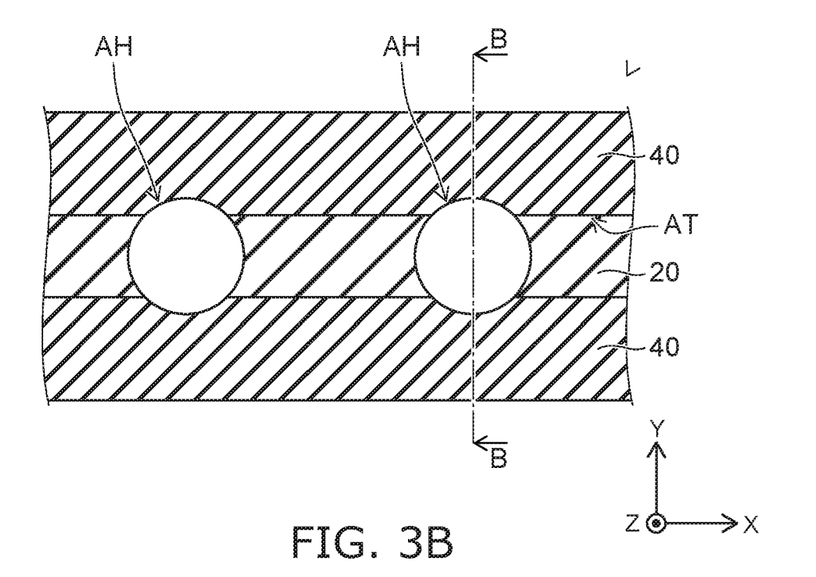

As shown in FIGS. 3A and 3B, a memory hole AH having a depth from the upper surface of the uppermost insulating film 30 to the source line SL is formed. As shown in FIG. 3B, a plurality of memory holes AH are arranged along the trench AT. The memory hole AH is formed by selectively removing part of each of the insulating films 20, 30 and the sacrificial film 40 using e.g. anisotropic RIE (reactive ion etching).

Figure 4A:
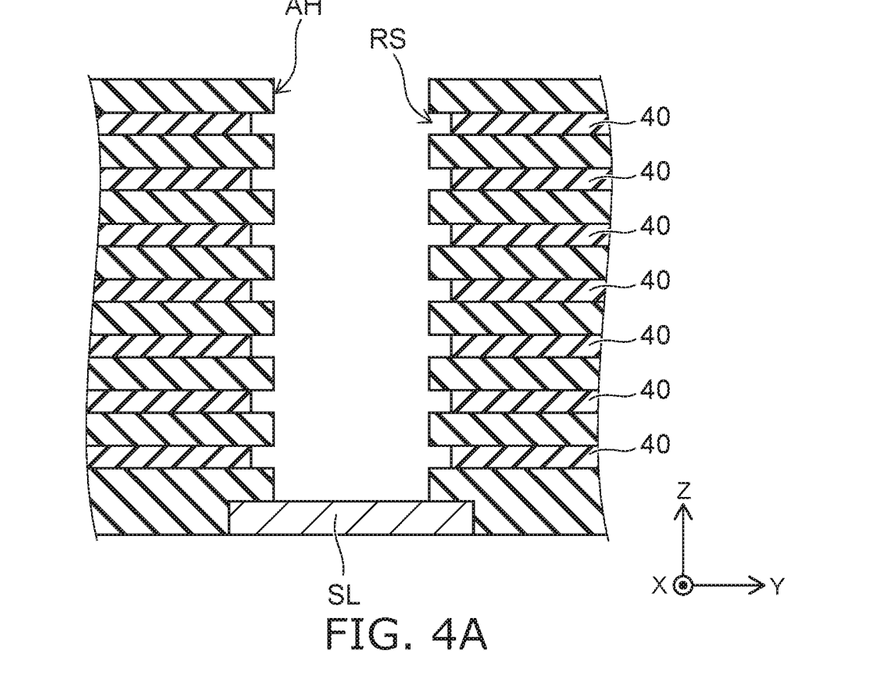

As shown in FIG. 4A, a recess part RS is formed in the inner wall of the memory hole AH. The recess part RS is formed by e.g. selectively removing part of the sacrificial film 40 exposed at the inner wall of the memory hole AH. The recess part RS is selectively removed by e.g. wet etching with hot phosphoric acid.

Figure 4B:
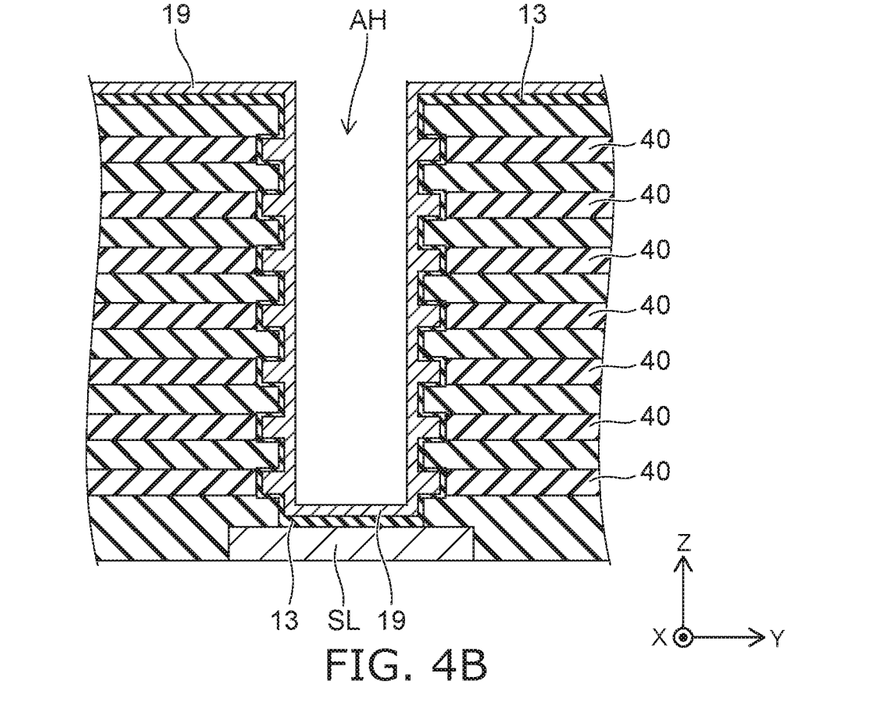

As shown in FIG. 4B, an insulating film 13 and a conductive layer 19 covering the inner surface of the memory hole AH are formed. The insulating film 13 is e.g. a silicon oxide film formed using CVD. The insulating film 13 is formed so as to cover the end surface of the sacrificial film 40 exposed at the recess part RS. The conductive layer 19 is e.g. a polysilicon layer or an amorphous silicon layer formed using CVD. The conductive layer 19 is deposited on the insulating film 13. The conductive layer 19 is formed so as to bury the internal space of the recess part RS.

Figure 5A:
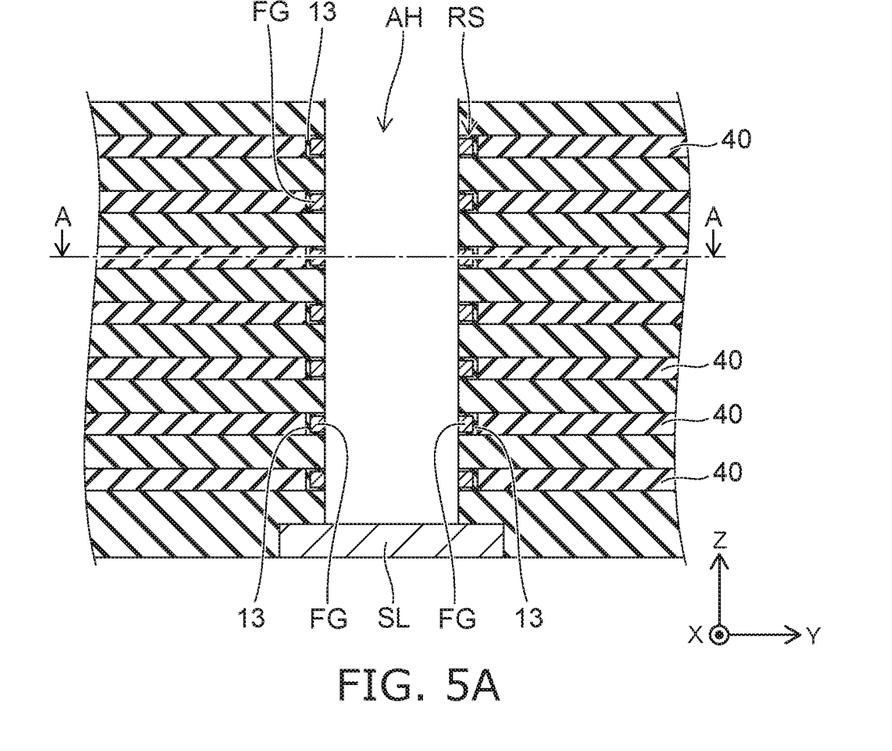
Figure 5B:
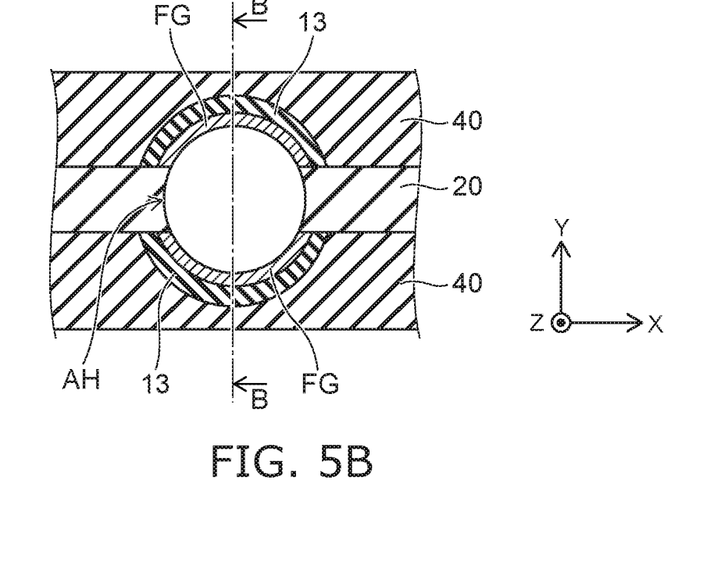

As shown in FIGS. 5A and 5B, a floating gate FG is formed inside the recess part RS. The floating gate FG is formed by removing the conductive layer 19 deposited on the end surface of the insulating film 30 inside the memory hole AH. The conductive layer 19 is removed using e.g. dry etching while leaving the portion provided inside the recess part RS. Furthermore, the insulating film 13 is removed to expose part of the source line SL at the bottom surface of the memory hole AH.

Figure 6:
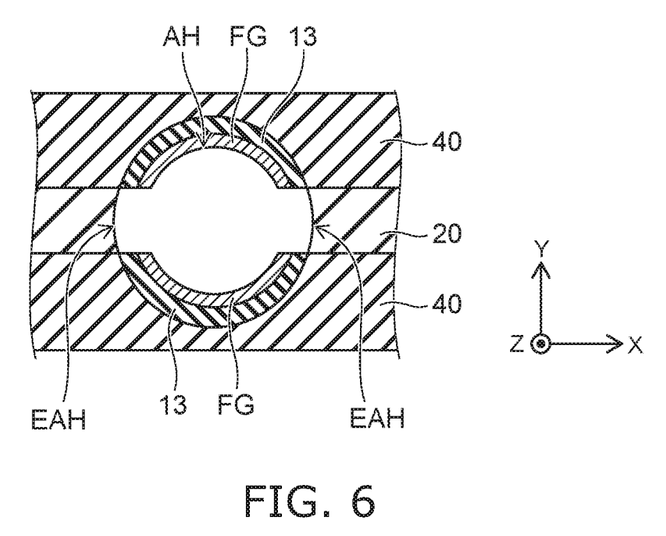

As shown in FIG. 6, part of the insulating film 20 is selectively removed to form an extension part EAH in which the memory hole AH is extended in the X-direction and the −X-direction. For instance, the insulating films 20 and 30 are both silicon oxide films. In this case, the method or condition for forming the insulating film 20 and the insulating film 30 is changed so that the etching rate of the insulating film 20 is faster than the etching rate of the insulating film 30. The insulating film 20 is selectively removed by e.g. wet etching.

Figure 7A:
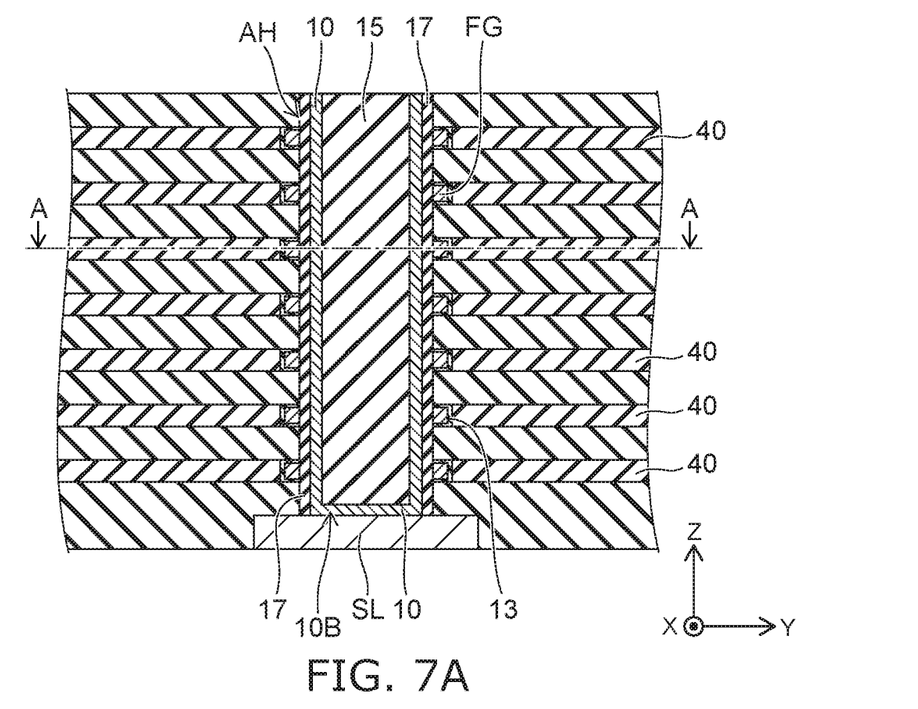
Figure 7B:
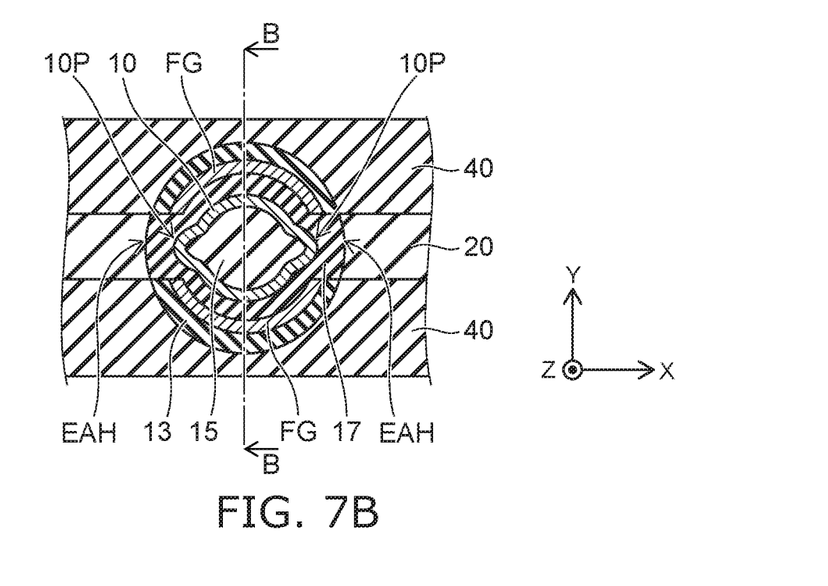

As shown in FIGS. 7A and 7B, a semiconductor film 10, an insulating core 15, and an insulating film 17 are formed inside the memory hole AH. The insulating film 17 is e.g. a silicon oxide film and formed so as to cover the floating gate FG. The semiconductor film 10 is e.g. a polysilicon layer or an amorphous silicon layer and deposited on the insulating film 17. The insulating core 15 is e.g. silicon oxide and formed so as to bury the internal space of the memory hole AH. The insulating film 17, the semiconductor film 10, and the insulating core 15 are formed using e.g. CVD.

The insulating film 17 is selectively removed while leaving the portion covering the inner wall of the memory hole AH before forming the semiconductor film 10. Thus, the semiconductor film 10 is formed in contact with the source line SL in its lower end 10B. Because the memory hole AH is provided with the extension part EAH, the semiconductor film 10 is formed so as to have a projected part 10P extending in the X-direction and the −X-direction.

As shown in FIG. 7B, the insulating core 15 is also formed so as to have a projected part extending in the X-direction and the −X-direction.

Figure 8A:
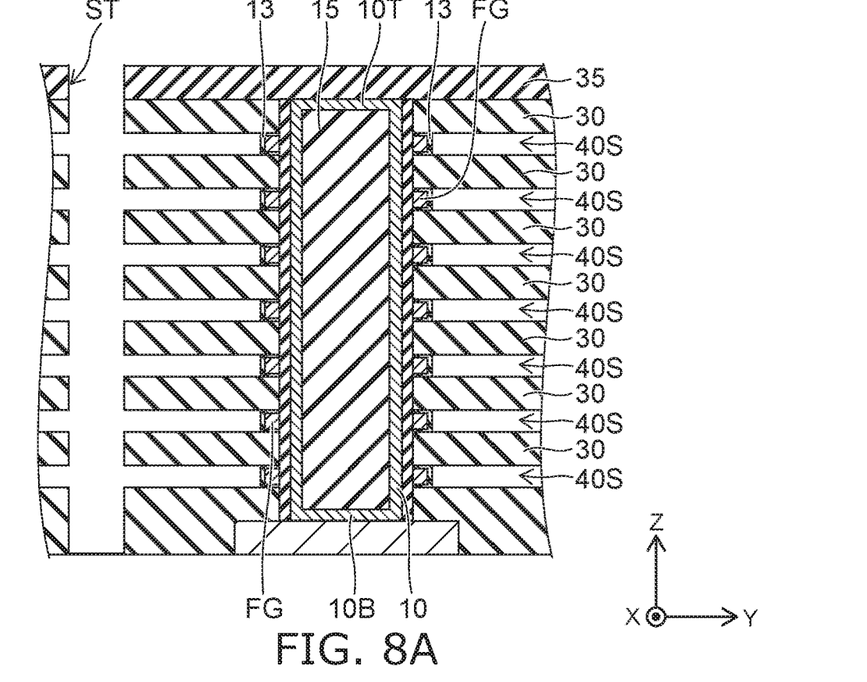

As shown in FIG. 8A, the sacrificial film 40 is selectively removed to form a space 40S between the insulating films 30. The sacrificial film 40 is selectively removed by e.g. supplying an etching liquid such as phosphoric acid through a slit ST.

For instance, an insulating film 35 is formed after forming an upper end 10T of the semiconductor film 10 covering the upper end of the insulating core 15. The upper end 10T of the semiconductor film 10 is e.g. a conductive amorphous silicon layer. The insulating film 35 is e.g. a silicon oxide film formed using CVD.

Subsequently, a slit ST is formed by selectively removing part of the insulating films 30, 35 and the sacrificial films 40. The slit ST extends in e.g. the X-direction and divides the insulating films 30, 35 and the sacrificial films 40. Then, an etching liquid is supplied through the slit ST. Thus, the sacrificial films 40 are selectively dissolved while leaving the insulating films 30 and 35.

Figure 8B:
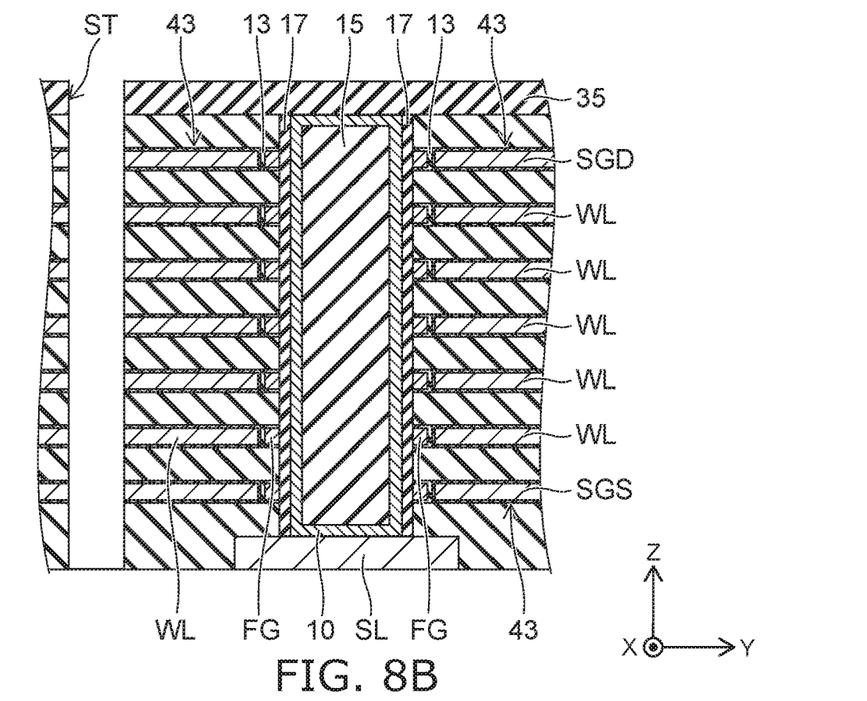

As shown in FIG. 8B, word lines WL and select gates SGS and SGD are each formed inside the space 40S. The word lines WL and the select gates SGS and SGD are e.g. metal layers containing tungsten.

The word lines WL and the select gates SGS and SGD are formed by e.g. depositing a metal layer inside the space 40S using the CVD method. The raw material gas of CVD is supplied through the slit ST. An insulating film 43 covering the inner surface of the space 40S is formed before forming the metal layer. The insulating film 43 is e.g. an aluminum oxide film.

Subsequently, the inside of the slit ST is buried with an insulating film, not shown. Then, a connection plug CJ is formed in contact with the upper end 10T of the semiconductor film 10. Furthermore, a bit line BL is formed. Thus, the memory device 1 is completed (see FIG. 1B).

In the memory device 1, the insulating film 17 provided between the semiconductor film 10 and the floating gate FG functions as e.g. a tunnel insulating film. The insulating film 13 and the insulating film 43 located between the word line WL and the floating gate FG functions as e.g. a block insulating film.

In the memory device 1 according to this embodiment, the semiconductor film 10 is provided with a projected part 10P. This can expand the width of the channel region facing the word line WL and increase the cell current at data read time.

Furthermore, the cell current can be increased also by controlling the voltage supplied to the word lines WL1 and WL2. For instance, when data is read from the memory cell MC1 including the floating gate FG1 (see FIG. 1A), the cell current can be increased by supplying the read voltage $V_{READ}$ also to the word line WL2.

(Second Embodiment)

Figure 9A:
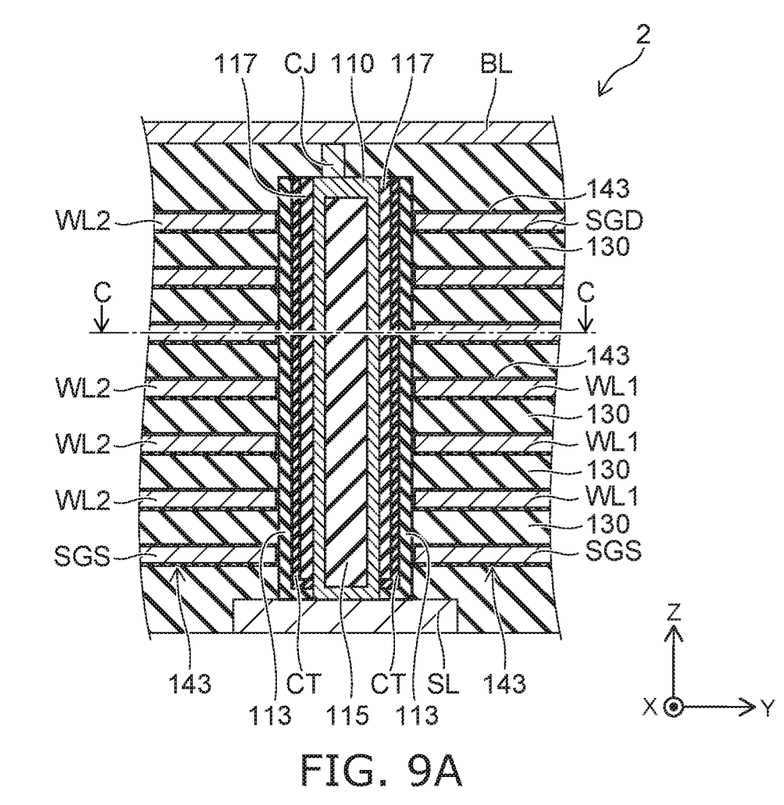
FIGS. 9A and 9B are schematic views showing a memory device 2 according to a second embodiment.
Figure 9B:
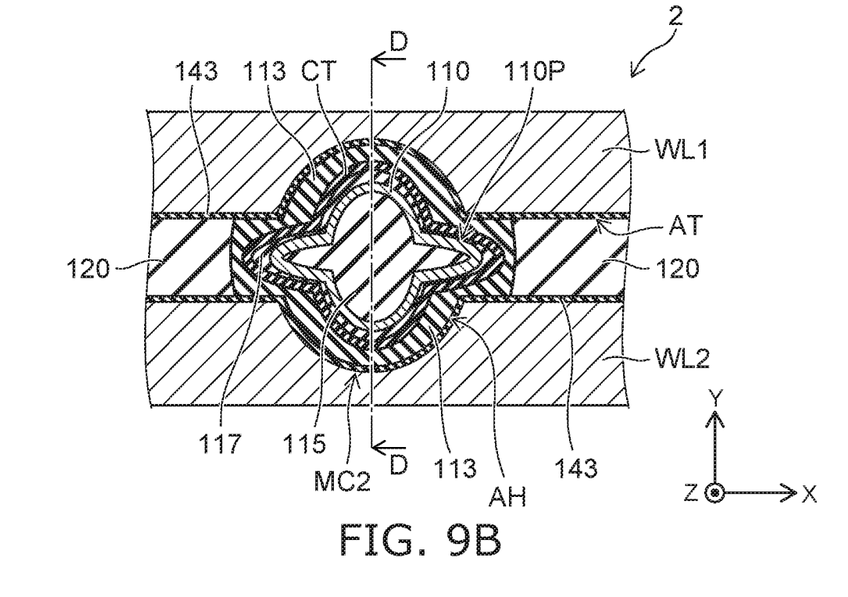

FIGS. 9A and 9B are schematic views showing a memory device 2 according to a second embodiment. FIG. 9A is a schematic view showing a cross section taken along line D-D shown in FIG. 9B. FIG. 9B is a schematic view showing a cross section taken along line C-C shown in FIG. 9A.

As shown in FIG. 9A, the memory device 2 includes a plurality of electrode layers (e.g. a select gate SGS, word lines WL1, WL2, and a select gate SGD) stacked in the Z-direction via insulating films 130. The insulating film 130 is e.g. a silicon oxide film.

A semiconductor film 110 extends in the Z-direction along an insulating core 115 and electrically connected to a bit line BL through a connection plug CJ. The semiconductor film 110 is connected at its lower end to a source line SL.

A charge trap film CT extends in the Z-direction along the semiconductor film 110. The charge trap film CT is located in a charge storage region between the semiconductor film 110 and the word line WL. The charge trap film CT traps the charge injected from the semiconductor film 110 in the portion located between the semiconductor film 110 and each word line WL. That is, the memory device 2 stores data by retaining charge in the charge trap film CT.

As shown in FIG. 9A, a trench AT and a memory hole AH are provided between the word lines WL1 and WL2. The semiconductor film 110 is placed inside the memory hole AH. An insulating film 120 is provided inside the trench AT. The insulating film 120 is e.g. a silicon oxide film.

The semiconductor film 110 is provided so as to surround an insulating core 115. The semiconductor film 110 is e.g. a polysilicon film or an amorphous silicon film. The insulating core 115 is e.g. silicon oxide. The semiconductor film 110 includes a projected part 110P extending in the X-direction and the −X-direction.

The memory device 2 further includes a charge trap film CT provided inside the memory hole AH. The charge trap film CT is e.g. a silicon nitride film. The charge trap film CT is provided so as to surround the semiconductor film 110. The charge trap film CT is placed between the semiconductor film 110 and the word line WL1 and between the semiconductor film 110 and the word line WL2. A memory cell MC1 includes part of the charge trap film CT located between the word line WL1 and the semiconductor film 110. A memory cell MC2 includes part of the charge trap film CT located between the word line WL2 and the semiconductor film 110.

The memory device 2 further includes insulating films 113, 117, and 143. The insulating film 113 is provided between the word line WL and the charge trap film CT. The insulating film 143 is provided between the word line WL and the insulating film 113 and between the word line WL and the insulating film 120.

The insulating films 113 and 143 function as e.g. a block insulating film between the word line WL and the insulating film 120. The insulating film 113 is e.g. a silicon oxide film. The insulating film 143 is e.g. an aluminum oxide film. The insulating film 117 is provided between the semiconductor film 110 and the charge trap film CT and functions as a tunnel insulating film. The insulating film 117 is e.g. a silicon oxide film. The insulating film 117 may be a stacked film including a silicon oxynitride film.

Also in the memory device 2, the semiconductor film 110 is provided so as to have a projected part 110P extending in the X-direction and the −X-direction. This can expand the width of the channel region facing the word line WL and increase the cell current at data read time in each of the memory cells MC1 and MC2.

Next, a method for manufacturing the memory device 2 according to the second embodiment is described with reference to FIGS. 10A to 12B. FIGS. 10A to 12B are schematic views sequentially showing the process for manufacturing the memory device 2.

Figure 10A:
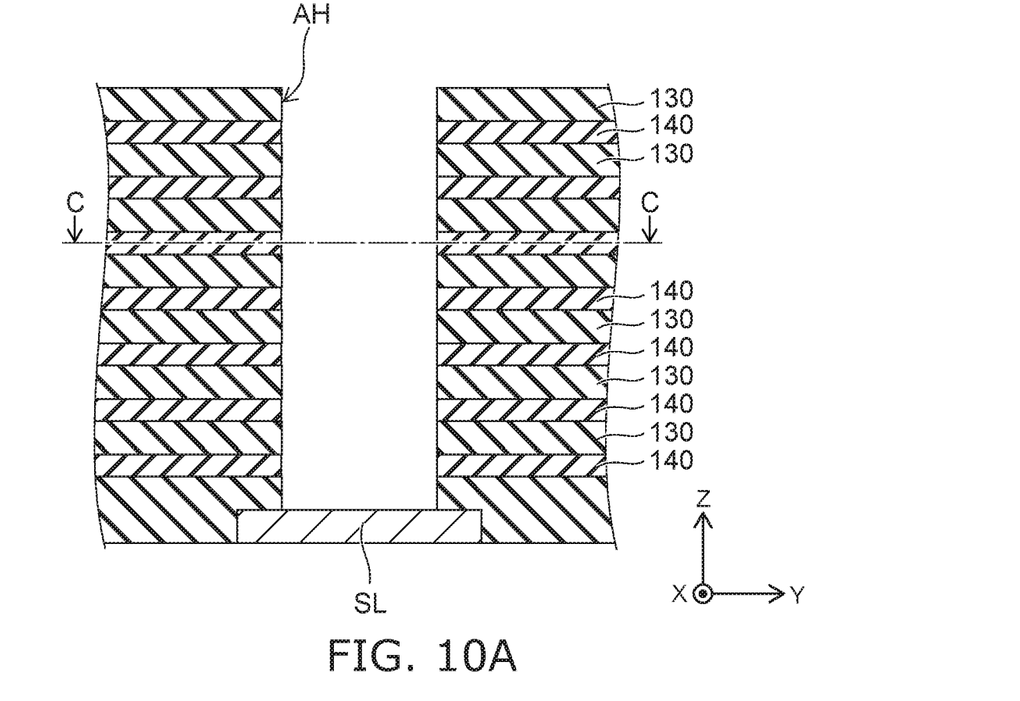
Figure 10B:
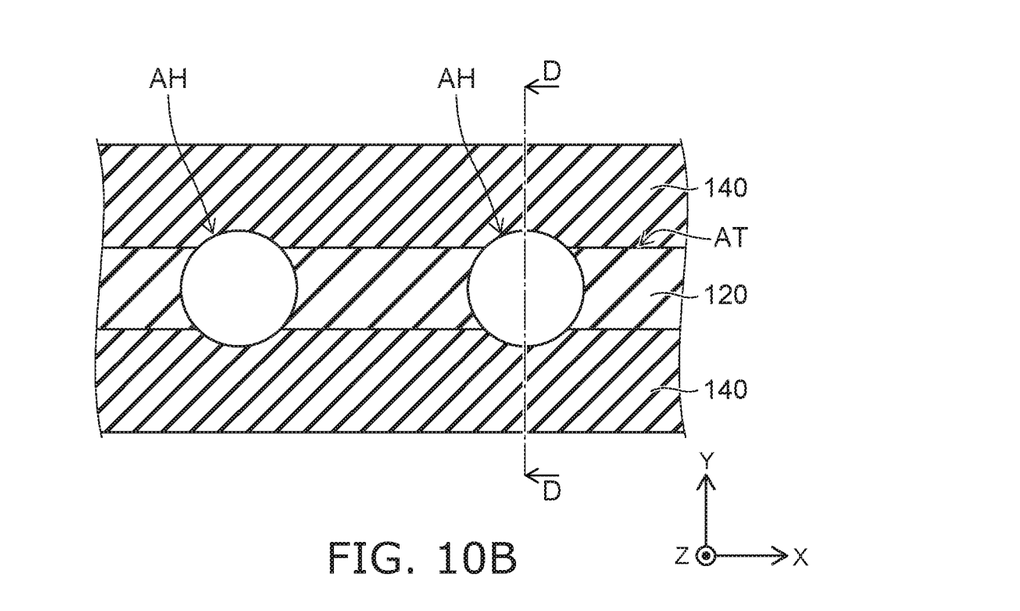
Figure 11:
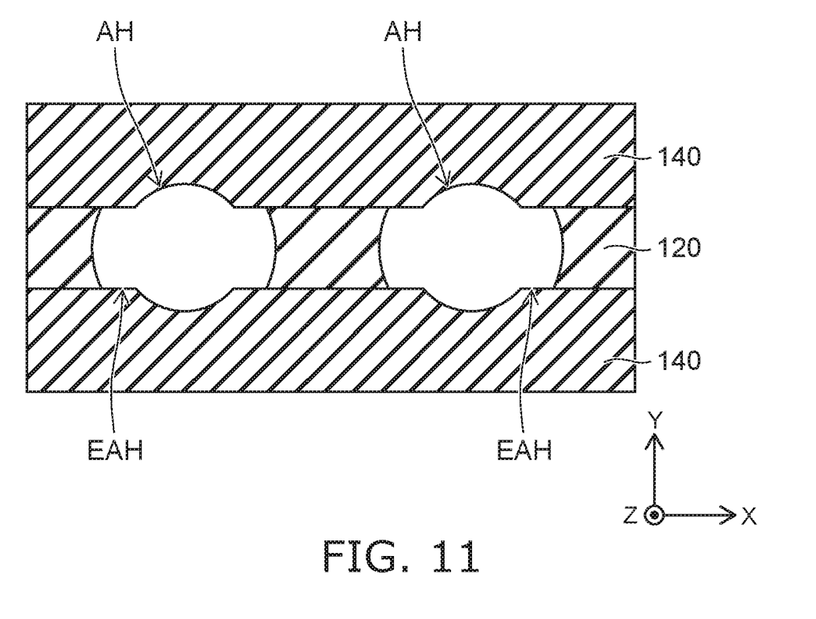
Figure 12A:
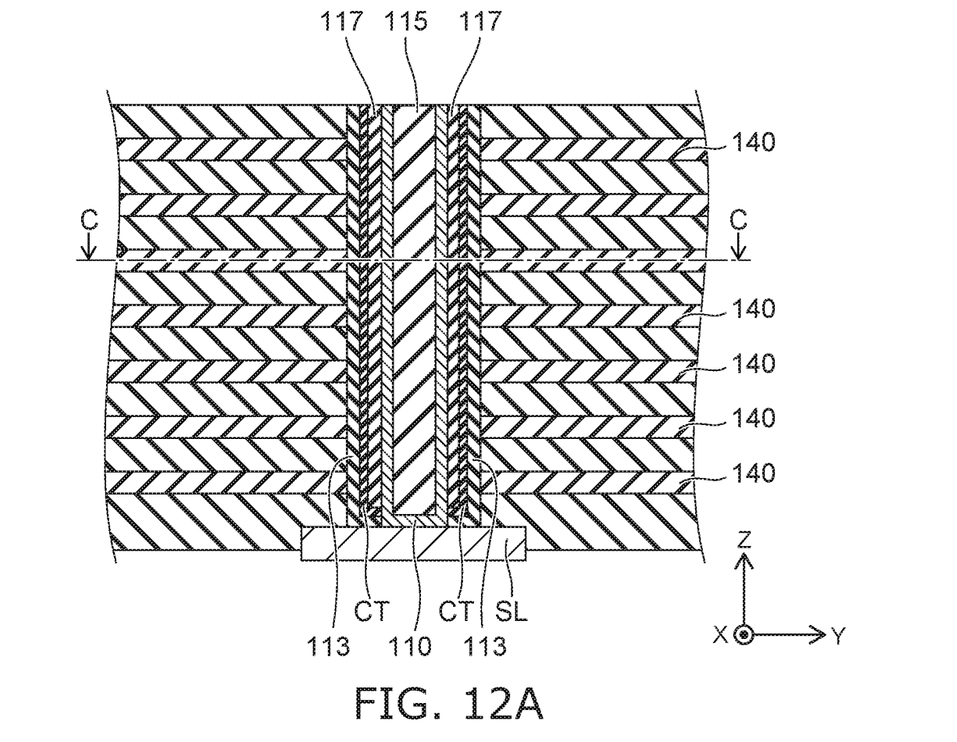
Figure 12B:
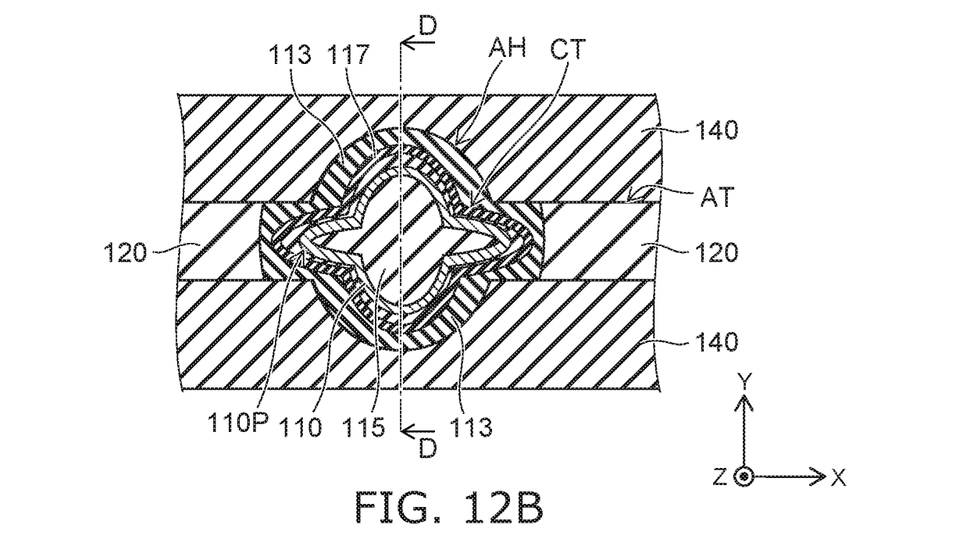

FIGS. 10A and 12A are schematic views showing a cross section corresponding to the cross section taken along line D-D shown in FIG. 9B. FIGS. 10B, 11, and 12B are schematic views showing a cross section corresponding to the cross section taken along line C-C shown in FIG. 9A.

As shown in FIGS. 10A and 10B, a memory hole AH having a depth from the upper surface of the uppermost insulating film 130 to the source line SL is formed. As shown in FIG. 10B, a plurality of memory holes AH are arranged along the extending direction of the trench AT. The memory hole AH is formed by selectively removing part of each of the insulating films 120, 130 and the sacrificial film 140 using e.g. anisotropic RIE. Here, the sacrificial film 140 is e.g. a silicon nitride film.

As shown in FIG. 11, part of the insulating film 120 is selectively removed to form an extension part EAH in which the memory hole AH is extended in the X-direction and the −X-direction. The insulating film 120 is selectively removed by e.g. wet etching.

As shown in FIGS. 12A and 12B, a semiconductor film 110, an insulating core 115, a charge trap film CT, and insulating films 113 and 117 are formed inside the memory hole AH. The insulating film 113 is formed so as to cover e.g. the inner wall of the memory hole AH. The charge trap film CT is formed so as to cover e.g. the insulating film 113. The insulating film 117 is formed so as to cover e.g. the charge trap film CT.

The semiconductor film 110 is deposited e.g. on the insulating film 117 and on the bottom surface of the memory hole AH. The insulating film 113, the charge trap film CT, and the insulating film 17 are selectively removed while leaving the portion covering the inner wall of the memory hole AH before forming the semiconductor film 110. Thus, the semiconductor film 110 is formed in contact with the source line SL at the bottom surface of the memory hole AH.

Subsequently, a slit ST, not shown, is formed. Then, the sacrificial film 140 is replaced by a metal layer to form word lines WL and select gates SGS and SGD.

Also in the manufacturing method according to this embodiment, the memory hole AH is provided with the extension part EAH. Thus, the semiconductor film 110 is formed so as to have a projected part 110P extending in the X-direction and the −X-direction. Simultaneously, the charge trap film CT and the insulating core 115 are formed so as to have a projected part extending in the X-direction and the −X-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a substrate;
   a first electrode extending in a first direction parallel to a surface of the substrate and having a first surface and a second surface, the first surface being spread in the first direction and a second direction crossing the first direction, the second direction being perpendicular to the substrate, and the second surface being spread in the first direction and the second direction, having a periphery connected to the first surface, and being provided to extend inward in a third direction with respect to the first surface, the third direction being parallel to the substrate and crossing the first direction;
   a second electrode extending in the first direction and having a third surface and a fourth surface, the third surface being spaced from the first electrode in a fourth direction opposite to the third direction, and spreading in the first direction and the second direction, the fourth surface being opposed to the second surface and spreading in the first direction and the second direction, having a periphery connected to the third surface, and being provided to extend inward in the fourth direction with respect to the third surface;
   a first signal line provided between the second surface and the fourth surface and extending in the second direction;
   a first charge storage film provided between the first signal line and the first electrode, the first charge storage film including first parts provided at both ends of the first charge storage film in the first direction and a second part located between the first parts, the second part being provided to protrude in the third direction toward the second surface with respect to the first parts; and
   a second charge storage film provided between the first signal line and the second electrode, the second charge storage film including third parts provided at both ends of the second charge storage film in the first direction and a fourth part located between the third parts, the fourth part being provided to protrude in the fourth direction toward the fourth surface with respect to the third parts,
   a distance along the third direction between the second surface and the fourth surface being larger than a distance along the third direction between the first surface and the third surface,
   in a cross section passing through the first charge storage film and the second charge storage film and being parallel to the surface of the substrate, the first signal line having a contour formed from a fifth part opposed to the second part, a sixth part opposed to the fourth part, a seventh part connected to one end of the fifth part and one end of the sixth part, the seventh part being provided in the first direction, and an eighth part connected to the other end of the fifth part and the other end of the sixth part, the eighth part being provided in a direction opposite to the first direction,
   the seventh part including a portion having a different curvature from a vicinity of the one end of the fifth part or a vicinity of the one end of the sixth part,
   the eighth part including a portion having a different curvature from a vicinity of the other end of the fifth part or a vicinity of the other end of the sixth part,
   wherein the first signal line has a first distance along the third direction from the fifth part to the sixth part and a second distance along the first direction from the seventh part to the eighth part, the first distance being smaller than the second distance.

2. The device according to claim 1, wherein the first part and the second part, and the third part and the fourth part, are each formed to extend smoothly and have a curvature in the cross section.

3. The device according to claim 1, wherein the seventh part and the eighth part are provided at a position in the third direction between a position in the third direction of the first part and a position in the third direction of the third parts, and being provided at a position in the first direction different from a position in the first direction of the first parts and the position in the first direction of the third parts.

4. The device according to claim 1, further comprising:
   a second signal line extending in the second direction, the second signal line being arranged in the first direction and provided at the positions different from a position of the first signal line, wherein the second surface and the fourth surface are provided in a plurality, and the second signal line pass through a region between the second surface and the fourth surface.

5. The device according to claim 1, wherein the first signal line has the center axis passing in the second direction through a crossing position of a first line along the third direction and a second line along the first direction, the first line connecting top ends of the second part and the fourth part, the second lined connecting top ends of the seventh part and the eighth part.

6. The device according to claim 1, wherein the first signal line is positioned inside an ellipse having a long axis in the first direction and a short axis in the third direction, the ellipse contacting the fifth part and the sixth part at both ends of the short axis, the ellipse contacting the seventh part and the eighth part at both ends of the long axis, and
   the first signal line has a contour along a periphery of the first signal line, a distance from the contour to the ellipse varying depending on a position on the contour, the distance from the contour to the ellipse in the third direction gradually decreases in the fifth part as a position on the contour approaches a contact position of the ellipse and the fifth part, the distance from the contour to the ellipse in the third direction gradually decreases in the sixth part as a position on the contour approaches a contact position of the ellipse and the sixth part, the distance from the contour to the ellipse in the third direction gradually decreases in the seventh part as a position on the contour approaches a contact position of the ellipse and the seventh part, and the distance from the contour to the ellipse in the third direction gradually decreases in the eighth part as a position on the contour approaches a contact position of the ellipse and the eighth part.

7. The device according to claim 1, wherein the first signal line has first end points in the first direction and second end points in the third direction in the cross section, the first end points being included in the seventh part and the eighth part, respectively, the second end points being included in the fifth part and the sixth part, respectively;

the first signal line has a contour passing through the first and second end points, a distance to the contour from a crossing point of a line connecting the first end points and a line connecting the second end points varying depending on a position on the contour;

the contour includes a first portion, a second portion and a midpoint, the midpoint being positioned between each of the first end points and each of the second end points, the first portion being positioned between each of the first end points and the midpoint, the second portion being positioned between the midpoint and each of the second end points; and the distance between the crossing point and the contour gradually decreases in the first portion as the position on the contour moves from each of the first end points to the midpoint, and gradually increases in the second portion as the position on the contour moves from the midpoint to each of the second end points.

8. The device according to claim 1, wherein in the cross section, the seventh part and the eighth part of the first signal line correspond to first end points of the first signal line in the first direction, respectively;

the fifth part and the sixth part of the signal line correspond to second end points of the first signal line in the third direction, respectively;

the first signal line has a contour connecting from the fifth part to the eighth part, a distance to the contour from a crossing point of a line connecting the first end points and a line connecting the second end points varying depending on a position on the contour;

the contour includes a first contour portion, a second contour portion and a midpoint, the midpoint being positioned on a way along the contour from the seventh part to the eighth part, the first contour portion being positioned between the seventh part and the midpoint, the second contour portion being positioned between the midpoint and one of the fifth part and the sixth part; and the distance gradually decreases in the first contour portion as the position on the contour moves from the seventh part to the midpoint, and gradually increases in the second contour portion as the position on the contour moves from the midpoint to the one of the fifth part and the sixth part.

9. The device according to claim 1, wherein
the first charge storage film does not extend between the signal line and the first surface, and
the second charge storage film does not extend between the signal line and the third surface.

10. The device according to claim 1, wherein,
the first electrode is provided in a plurality, the plurality of first electrodes being spaced from each other in the second direction;
the second electrode is provided in a plurality, the plurality of second electrodes being spaced from each other in the second direction;
the first charge storage film is provided in a plurality, the plurality of first charge storage films being spaced from each other in the second direction, the plurality of first charge storage films being placed between the first signal line and the plurality of first electrodes, respectively; and
the second charge storage film is provided in a plurality, the plurality of second charge storage films being spaced from each other in the second direction, the plurality of second charge storage film being placed between the first signal line and the plurality of second electrodes, respectively.

11. The device according to claim 1, wherein the first charge storage film and the second charge storage film are conductive and electrically insulated from the first electrode, the second electrode, and the first signal line via an insulating film.

12. The device according to claim 11, wherein the insulating film is provided so as to bury a space between the first electrode and the second electrode.

13. The device according to claim 1, further comprising:
an insulator provided inside the first signal line and extending in the second direction.

14. The device according to claim 1, wherein the first signal line contains a semiconductor.

15. The device according to claim 1, further comprising:
a first interconnect connected to one end of the first signal line.

16. The device according to claim 15, further comprising:
a second interconnect connected to the other end of the first signal line and extending in the third direction.

17. The device according to claim 1, wherein the first charge storage film and the second charge storage film are integrally provided around the first signal line in the cross section and extend in the second direction along the first signal line.

* * * * *